United States Patent [19]

Huang

[11] Patent Number: 4,968,956

[45] Date of Patent: Nov. 6, 1990

[54] MICROWAVE PHASE MODULATOR HAVING A QUADRATURE PATH WITH PHASE OFFSET

[75] Inventor: Marshall Y. Huang, Rancho Palos Verdes, Calif.

[73] Assignee: TRW Inc., Redondo Beach, Calif.

[21] Appl. No.: 445,573

[22] Filed: Dec. 4, 1989

[51] Int. Cl.$^5$ ............................ H03C 3/04; H03C 3/40
[52] U.S. Cl. ...................................... 332/145; 455/110
[58] Field of Search ............... 332/144, 145, 146, 125, 332/129, 130, 134, 103, 104, 105; 455/42, 110, 111; 375/52, 67; 333/139, 164

[56] References Cited

U.S. PATENT DOCUMENTS

| | | | |
|---|---|---|---|
| 3,755,739 | 8/1973 | Okano | 375/67 |
| 4,216,542 | 8/1980 | Hermesmeyer | 375/67 |
| 4,338,579 | 7/1982 | Rhodes | 332/21 |
| 4,540,958 | 9/1985 | Neyens et al. | 332/16 R |
| 4,612,518 | 9/1986 | Gans et al. | 332/21 |
| 4,613,976 | 9/1986 | Sewerinson et al. | 375/52 |
| 4,672,634 | 6/1987 | Chung et al. | 375/62 |
| 4,680,775 | 7/1987 | Exarque et al. | 375/39 |
| 4,726,039 | 2/1988 | Piesinger | 375/67 |
| 4,736,170 | 4/1988 | Wu et al. | 332/21 |
| 4,788,509 | 11/1988 | Bahl et al. | 330/54 |
| 4,881,049 | 11/1989 | Yagi | 332/103 |

*Primary Examiner*—Siegfried H. Grimm
*Attorney, Agent, or Firm*—Noel F. Heal; Ronald L. Taylor

[57] ABSTRACT

Apparatus, and a method for its use, for linearly phase-modulating a microwave signal with only minimal accompanying amplitude modulation. An incoming signal is divided into two components, one of which is shifted by ninety degrees from the other, plus or minus a small offset phase angle selected to minimize amplitude variations in an output signal. The component with the offset phase angle is amplitude modulated, then recombined with the other component to provide the desired phase-modulated output signal. When the offset phase angle and the nominal amplitude of the amplitude-modulated component are appropriately selected, phase modulation of the output signal is substantially linearly related to the amplitude modulation of the offset input signal, and amplitude modulation of the output signal is minimized.

9 Claims, 1 Drawing Sheet (A) BLOCK DIAGRAM (A) BLOCK DIAGRAM

MICROWAVE PHASE MODULATOR HAVING A QUADRATURE PATH WITH PHASE OFFSET

BACKGROUND OF THE INVENTION

This invention relates generally to microwave circuit components and, more particularly, to devices for providing phase modulation at microwave frequencies. An increasing number of microwave circuitry applications are implemented in the form of integrated circuitry, i.e. MMIC (microwave monolithic integrated circuitry). There is a requirement in many applications for a phase modulator that can be conveniently fabricated in MMIC form, for use in applications using frequency or phase modulation, such as in cellular telephones and other forms of microwave communication.

A well known technique for low-index phase modulation of microwave signals, i.e. modulation over a relatively small angular range, is to split an incoming signal into initially equal components (I and Q), and to subject one component to a 90-degree phase delay. If one of the components is then varied in amplitude in accordance with a modulation signal, this results in a variation in phase angle when the two components are recombined. One difficulty with this approach is that it produces amplitude modulation of the incoming signal. Moreover, the resultant phase shift is not linearly related to the amplitude of the modulating signal. Amplitude modulation of the output signal can be eliminated if the amplitudes of both quadrature signals are carefully controlled, but this is a relatively complex task.

The object of the invention is to provide a microwave phase-modulated output signal with only minimal accompanying amplitude modulation, and more linearly related to the modulating signal.

SUMMARY OF THE INVENTION

The present invention resides in a microwave low-index phase modulator that minimizes undesirable amplitude changes usually present in phase modulators of simple construction. Briefly, and in general terms, the microwave phase modulator of the invention comprises means for dividing an incoming signal into two components I and Q such that the Q component has a phase lagging the I component by ninety degrees plus or minus a selected offset angle, means for modulating the amplitude of the Q component about a selected nominal amplitude, and means for combining the I component and the amplitude-modulated Q component, to produce an output signal with a phase modulation corresponding to the amplitude modulation of the Q component, but with minimal amplitude modulation in the output signal itself.

Peferably, the selected offset angle for the phase of the Q component is approximately equal to a desired maximum phase modulation from a nominal phase angle, and the selected nominal amplitude of the Q component is approximately equal to the amplitude of the I component multiplied by the sine of the selected offset angle.

More specifically, and by way of example, the selected offset angle is approximately ten degrees, to provide a phase modulation of approximately ten degrees on each side of the nominal phase angle.

In the illustrative embodiment of the invention, the means for dividing the input signal and the means for combining signal components to produce the output signal each include a rat race device. For convenience, the means for providing phase shift in the Q component is included in one of the rat race devices.

In terms of a novel method, the invention comprises the steps of dividing an incoming microwave signal into two components, I and Q, applying a phase lag to the Q component, with respect to the I component, of ninety degrees plus or minus a selected offset angle, amplifying the Q component to a selected nominal amplitude, modulating the amplitude of the Q component, and combining the I component and the amplified and amplitude-modulated Q component to obtain a phase-modulated output signal with minimal amplitude modulation.

It will be appreciated from the foregoing that the present invention represents a significant advance in the field of microwave phase modulators. In particular, the invention resides in a phase modulator of simple construction, having only one gain-adjustable amplifier, but providing a phase-modulated output signal with only minimal amplitude variations. Moreover, the modulator of the invention provides a phase output that varies in a practically linear manner with input voltage. Other aspects and advantages of the invention will become apparent from the following more detailed description, taken in conjunction with the accompanying drawings.

DESCRIPTION OF THE PREFERRED EMBODIMENT

Figure 1:
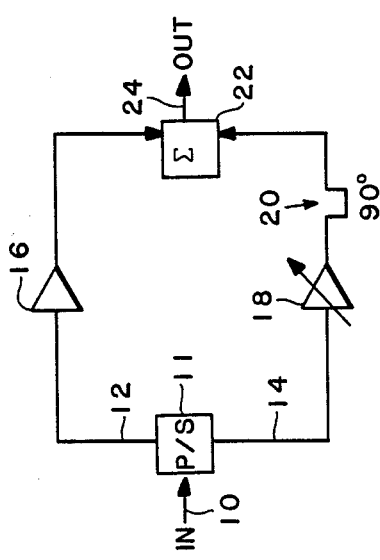
FIG. 1 is a block diagram of a prior art technique for microwave phase modulation.

As shown in the drawings for purposes of illustration, the present invention is concerned with a technique for phase modulation of microwave signals. FIG. 1 shows a common technique for microwave phase modulation, in which an incoming signal, indicated by reference numeral 10, is split by a power divider 11 into two, initially equal components on lines 12 and 14, connected to the inputs of two microwave amplifiers 16 and 18, one of which (18) has a variable gain, as indicated by the arrow. The output of amplifier 18 is subject to a 90-degree phase shift, as indicated at 20. This may be effected merely by providing that line 14 is longer than line 12 by a quarter wavelength at the frequency of operation of the apparatus. Lines 12 and 14 are both input to a signal summer or combiner 22, from which an output signal 24 is obtained.

Figure 2:
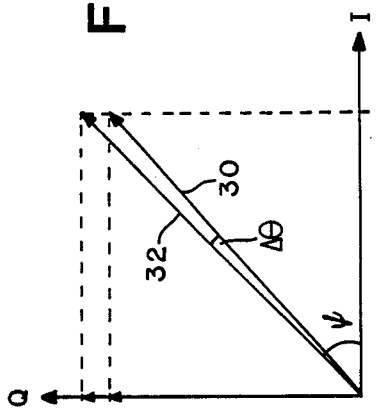
FIG. 2 is a phasor diagram showing how the apparatus shown in FIG. 1 functions as a phase modulator.

In FIG. 2, the fixed-magnitude output from amplifier 16 is represented as a phasor along the horizontal or I axis, and the variable magnitude of the output from the phase shifter 20 is represented as a phasor along the vertical or Q axis. Two resultant phasors of output signals are shown at 30 and 32 by way of example. For illustration, it is assumed that the I output signal has a magnitude of 1.0 and that the Q output signal is modulated in each direction from the same magnitude. Phasor 30 represents the condition in which Q is also 1.0, and the phasor angle $\psi$ to the I axis is 45 degrees. Table 1, below, shows the variation in Q needed to provide a phase shift $\Delta\theta$ of up to 10 degrees in each direction, together with the corresponding values of ψ and the resultant phasor amplitude.

TABLE 1

| Q | ψ° | Δθ° | Amplitude |
|---|---|---|---|
| .70 | 35 | −10.0 | 1.221 |
| .84 | 40 | −5.0 | 1.306 |
| .90 | 42 | −3.0 | 1.345 |
| 1.00 | 45 | 0.0 | 1.414 |
| 1.10 | 47.7 | 2.7 | 1.487 |
| 1.19 | 50 | 5.0 | 1.554 |
| 1.43 | 55 | 10.0 | 1.745 |

As will be seen from Table 1, there is a relatively large swing, of about 40 percent, in amplitude over a phase shift range from +10° to −10°. This amplitude error may be reduced, theoretically to zero, by controlling both the I and Q amplitudes to achieve a desired phase shift. For small phase shifts, the necessary increments in I and Q amplitudes are functions of the sine and cosine of the phasor angle ψ, but computation of these increments would require more complicated circuitry. Therefore, there is still a need for a simple approach to phase modulation that minimizes accompanying changes in amplitude.

Figure 3:
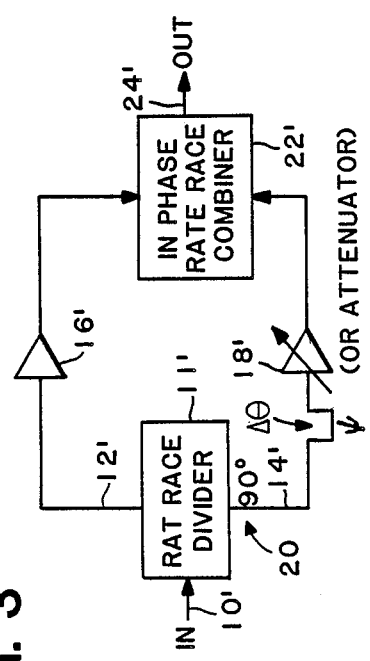
FIG.3 is a block diagram of the apparatus of present invention.

In accordance with the invention, an incoming signal is divided into two components as before, only one of which (Q) is variable in amplitude, but the Q component is subject to a fixed phase shift φ, which may be either positive or negative, and is chosen to minimize modulation of the amplitude with the phase angle. The apparatus is shown in FIG. 3.

The incoming signal 10' is divided into two component paths along lines 12' and 14' by a power divider in the form of a rat race device 11'. The separate paths 12' and 14' are connected to two amplifiers 16' and 18', the latter being variable in gain. Line 14' is subject to a 90-degree phase shift, as indicated at 20, and is also subject to a further phase shift of φ, as indicated at 40. For convenience, both of these phase shifts may be incorporated into the rat race divider 11'. Signals on the two lines 12' and 14' are recombined in an in-phase rat race combiner 22', to provide an output signal on line 24'.

In this specification, the term "amplifier" is intended to cover devices that reduce the amplitude of an input signal, i.e. attenuators, as well as those that magnify the amplitude. The principles of the invention apply equally well to an embodiment in which the variable-gain amplifier 18' is a variable attunuator.

Figure 4:
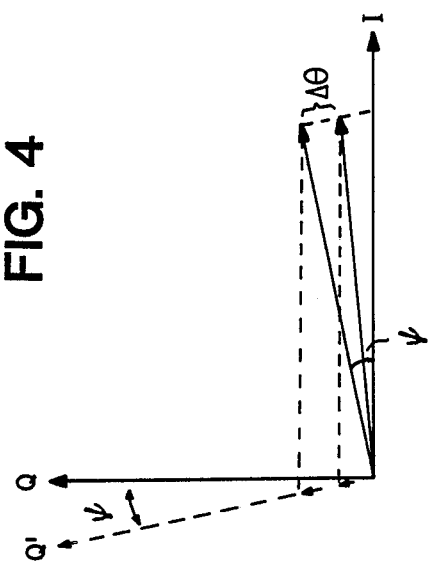
FIG. 4 is a phasor diagram showing how the apparatus of FIG. 4 operates as a phase modulator.

FIG. 4 shows the effect of the offset Q axis, referred to as Q'. When a phase modulation is effected by changing the magnitude of the Q value, the phasor amplitude is only minimally affected. Phasors 30' and 32' indicate a phase change of Δθ with minimal amplitude change. Theoretically, the optimum value for φ should be the same as the desired modulation angle. For example, if it is desired to provide for a phase modulation between and −10° and +10° the optimum value of φ should also be 10°. Further, the nominal, or neutral, value of Q should be the magnitude of I multiplied by the sine of the Q-axis displacement angle φ. For a phase modulation between −10° and +10°, the Q' axis should be displaced by 10° and the nominal Q' amplitude should be $$1.0 * \sin 10° \approx 0.17.$$

Table 2 provides another example, in which φ=15°, and sets forth the values of phasor amplitude and angle for phase shifts of up to approximately +10° and −10°.

TABLE 2

| Q | ψ° | Δθ° | Amplitude |
|---|---|---|---|
| .10 | 5.66 | −9.37 | .9798 |
| .20 | 11.49 | −3.54 | .9694 |
| .26 | 15.03 | 0.0 | .9681 |
| .30 | 17.39 | +2.36 | .9693 |
| .40 | 23.23 | +8.20 | .9794 |
| .44 | 25.53 | +10.5 | .9863 |

It will be seen from Table 2 that the phasor amplitude can be maintained relatively constant, within one percent, for small phase shift angles up to about ten degrees, but without the need to control both I and Q amplitudes. Expressed in decibels, the difference in amplitude for phase-shift angles between zero and ten degrees in either direction is approximately 0.16dB. This compares with a ratio of about 1.5dB for the difference in amplitude over a ten-degree range for the FIG. 1 configuration, using the first and last rows of Table 1.

In brief, the invention provides a simple technique for phase modulation without the need for complex circuitry. Moreover, the phase modulator of the invention uses simple components that can be easily incorporated into microwave monolithic integrated circuits (MMIC). The rat race divider and combiner can be conventionally implemented in integrated circuit form using microstrip waveguides, with the necessary phase shifts incorporated into the divider, and the amplifiers may be of any conventional MMIC design.

It will be appreciated from the foregoing that the present invention represents a significant advance in the field of microwave circuitry, in that the phase of a signal may be modulated over a small but substantial range, providing a phase modulation that is substantially linear with respect to a controlling input signal, while keeping any accompanying amplitude modulation to a minimum.

In this specification, the term "microwaves" is intended to include radiation of decimeter, centimeter and millimeter wavelengths, consistent with the definition given on page 1 of "Introduction to Microwaves," by Fred E. Gardiol, published by Artech House, Dedham, Mass. (1984). Also, it will be understood that the I and Q components may be interchanged without departing from the invention. A basic requirement of the invention is that there be two nominally orthogonal signal components, one of which is treated as a reference and the other given an angular offset, leading or lagging, and modulated in amplitude. The terms I and Q are employed only for convenience in referring to the two components.

It will also be appreciated that, although an embodiment of the invention has been described in detail for purposes of illustration, various modifications may be made without departing from the spirit and scope of the invention. Accordingly, the invention is not to be limited except as by the appended claims.

I claim:

1. A microwave phase modulator, comprising:
    means for dividing an incoming signal into two components I and Q such that the phase of the Q component differs from the phase of the I component by ninety degrees plus or minus a selected offset angle;

means for modulating the amplitude of the Q component about a selected nominal amplitude; and means for combining the I component and the amplitude-modulated Q component, to produce an output signal with a phase modulation corresponding approximately linearly to the amplitude modulation of the Q component, but with minimal amplitude modulation in the output signal itself.

2. A microwave phase modulator as defined in claim 1, wherein:

the selected offset angle for the phase of the Q component is approximately equal to a desired maximum phase modulation from a nominal phase angle.

3. A microwave phase modulator as defined in claim 2, wherein:

the selected nominal amplitude of the Q component is approximately equal to the amplitude of the I component multiplied by the sine of the selected offset angle.

4. A microwave phase modulator as defined in claim 3, wherein:

the selected offset angle is approximately ten degrees, to provide a phase modulation of approximately ten degrees on each side of the nominal phase angle.

5. A microwave phase modulator as defined in claim 3, wherein:

the means for dividing and the means for combining each include a rat race device; and the means for providing phase shift in the Q component is included in one of the rat race devices.

6. A method of phase modulation in a microwave circuit, comprising the steps of:

dividing an incoming microwave signal into two components, I and Q;

interposing a phase difference in the Q component, with respect to the I component, of ninety degrees plus or minus a selected offset angle;

amplifying the I component and the Q component to selected nominal amplitudes;

modulating the amplitude of the Q component; and combining the amplified I component and the amplified and amplitude-modulated Q component to obtain an output signal having minimal amplitude modulation and a phase modulation that varies substantially linearly with the Q-component modulation.

7. A method as defined in claim 6, wherein:

the selected offset angle for the phase of the Q component is approximately equal to a desired maximum phase modulation from a nominal phase angle.

8. A method as defined in claim 7, wherein:

the selected nominal amplitude of the Q component is approximately equal to the nominal amplitude of the I component multiplied by the sine of the selected offset angle.

9. A method as defined in claim 8, wherein:

the selected offset angle is approximately ten degrees, to provide a phase modulation of approximately ten degrees on each side of the nominal phase angle.

* * * * *